US006614356B2

(12) United States Patent
Li

(10) Patent No.: US 6,614,356 B2
(45) Date of Patent: Sep. 2, 2003

(54) DIGITAL METER FOR USE OF CURRENT AND VOLTAGE

(76) Inventor: Tung-Liang Li, 58, Ma Yuan West St., Taichung (TW)

( * ) Notice: Subject to any disclaimer, the term of this patent is extended or adjusted under 35 U.S.C. 154(b) by 45 days.

(21) Appl. No.: 10/028,180

(22) Filed: Dec. 21, 2001

(65) Prior Publication Data

US 2003/0117290 A1 Jun. 26, 2003

(51) Int. Cl.[7] ............................................... G08B 21/00
(52) U.S. Cl. ...................... 340/660; 340/661; 340/662; 340/663; 340/664; 340/815.65; 324/120; 324/522
(58) Field of Search .................... 340/660, 661, 340/662, 663, 664, 636.1, 636.12, 636.13, 636.15, 815.43, 815.65, 815.69; 324/522, 103 R, 120

(56) References Cited

U.S. PATENT DOCUMENTS 5,543,707 A * 8/1996 Yoneyama et al. ......... 324/115
6,095,682 A * 8/2000 Hollander et al. .......... 374/121

* cited by examiner

Primary Examiner—Toan Pham

(57) ABSTRACT

The present invention relates to a digital meter for use of the current and voltage, including a front end signal processing device, a press button input device, a central processing unit (CPU), an LCD controller, an LCD, and an alarm device. When the signals detected by the front end signal processing device exceed the digital values of the maximum or minimum limit of the signal of the current and voltage set by the press button input device, the LCD controller may drive the LCD having different colors to light. Thus, the informed person may identify the detecting results of the current and voltage according to the different colors of the LCD.

4 Claims, 2 Drawing Sheets

DIGITAL METER FOR USE OF CURRENT AND VOLTAGE

BACKGROUND OF THE INVENTION

1. Field of the Invention

The present invention relates to a digital meter for use of the current and voltage, and more particularly to a digital meter for use of the current and voltage, wherein the digital meter may be operated easily and conveniently, and is not limited to the space distance of the location of the informed person.

2. Description of the Related Art

A conventional digital meter for use of the current and voltage in accordance with the prior art may provide digital values to indicate the detecting results of the current and voltage. However, the manner of indicating the detecting results is limited to the space distance. Thus, when the distance between the person to be informed and the indicator of the conventional digital meter exceeds the scope of the person's view, the detecting results cannot be transmitted to the person.

SUMMARY OF THE INVENTION

The present invention has arisen to mitigate and/or obviate the disadvantage of the conventional digital meter for use of the current and voltage.

The primary objective of the present invention is to provide a digital meter for use of the current and voltage, wherein when the signal value detected by the front end signal processing device is greater than the digital values of the maximum limit of the signal of the current and voltage set by the press button input device or smaller than the digital values of the minimum limit of the signal of the current and voltage set by the press button input device, the LCD controller may drive the LCD having different colors to light. Thus, the informed person may identify the detecting results of the current and voltage according to the different colors of the LCD, and the alarm device may emit an alarm sound to warn the informed person, thereby providing an alarm effect.

Another objective of the present invention is to provide a digital meter for use of the current and voltage, wherein the digital meter may be operated easily and conveniently.

A further objective of the present invention is to provide a digital meter for use of the current and voltage, wherein the different colors of the LCD may indicate if the digital values of the detected current and voltage exceed the values of the maximum and minimum limit set by the press button input device, so that the detected results of the current and voltage is not limited to the space distance of the location of the informed person.

In accordance with the present invention, there is provided a digital meter for use of the current and voltage, comprising a front end signal processing device, a press button input device, a central processing unit (CPU), an LCD controller, an LCD, and an alarm device, wherein:

the front end signal processing device may process the signal of the detected current and voltage, and transmit the signal into the CPU, the press button input device may set the digital values of the maximum and minimum limit of the signal of the current and voltage by the digital press buttons, and may transmit the digital set values into the CPU, the CPU may receive the signals input from the front end signal processing device and the press button input device, and may process the signals so as to drive the LCD controller and the alarm device, the LCD controller may drive the LCD having different colors to light according to the signals detected by the front end signal processing device and according to the digital values of the maximum and minimum limit of the signal of the current and voltage set by the press button input device, the alarm device has a three-color back light module, and may emit the alarm sounds according to the signals detected by the front end signal processing device and according to the digital values of the maximum and minimum limit of the signal of the current and voltage set by the press button input device.

Thus, when the signals detected by the front end signal processing device is greater than the digital values of the maximum limit of the signal of the current and voltage set by the press button input device or smaller than the digital values of the minimum limit of the signal of the current and voltage set by the press button input device, the LCD controller may drive the LCD having different colors to light, so that the informed person may identify the detecting results of the current and voltage according to the different colors of the LCD. At the same time, the alarm device may emit an alarm sound to warn the informed person, thereby providing an alarm effect.

In accordance with the present invention, there is also provided a digital meter for use of the current and voltage, comprising the analogue hardware procedures of:

(a) inputting the signal to be detected;

(b) selecting the voltage or the current;

(c) dividing the voltage;

(d) selecting the alternating current or the direct current;

(e) when the signal to be detected is the alternating current voltage, the alternating current voltage may enter alternating/direct current conversion circuit, so that the alternating current voltage may be converted into the direct current voltage;

(f) A/D conversion; and (g) inputting the digital signal.

Further benefits and advantages of the present invention will become apparent after a careful reading of the detailed description with appropriate reference to the accompanying drawings.

DETAILED DESCRIPTION OF THE INVENTION

Figure 1:
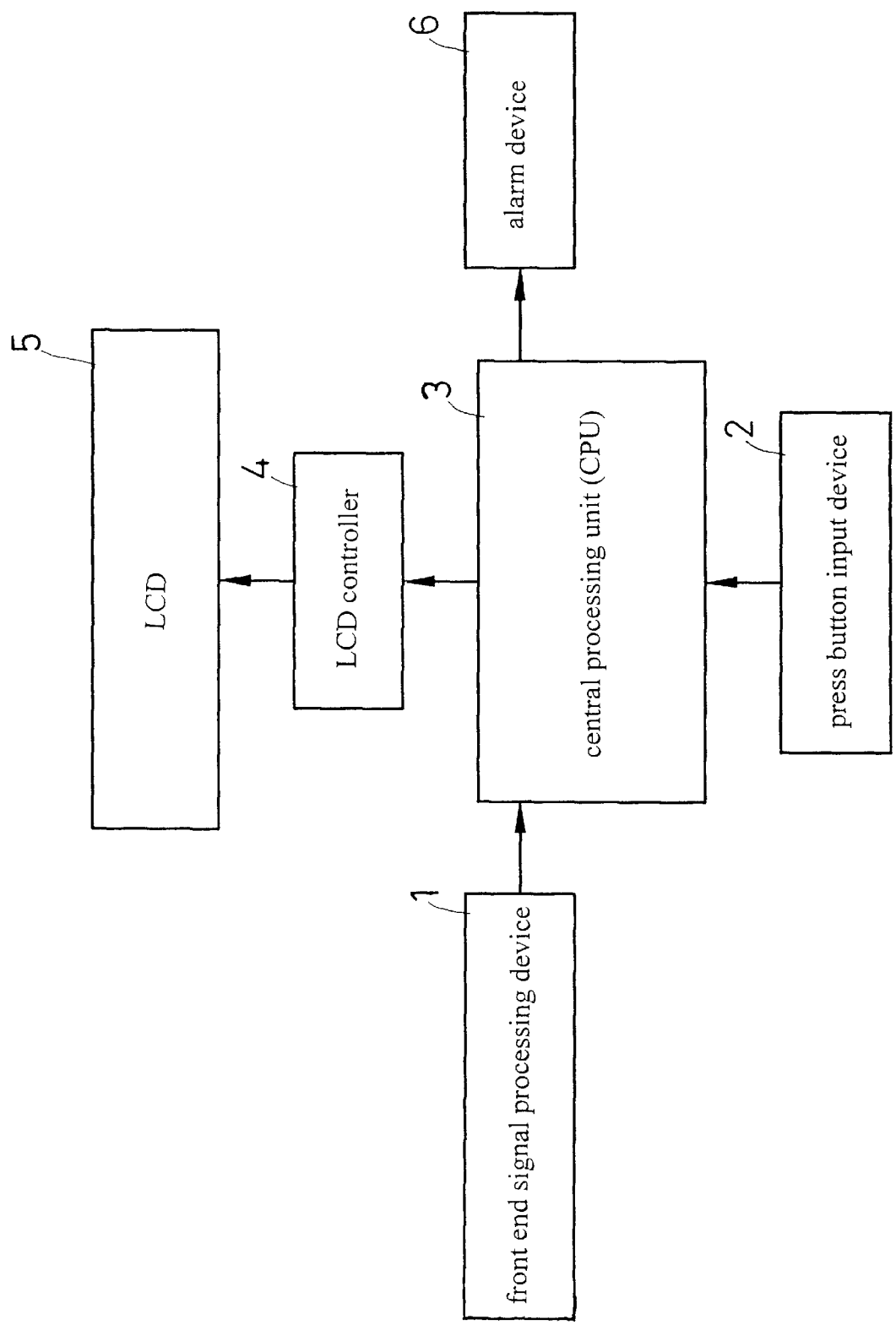
FIG. 1 is a block view of a digital meter for use of the current and voltage in accordance with a preferred embodiment of the present invention.

Referring to the drawings and initially to FIG. 1, a digital meter for use of the current and voltage in accordance with a preferred embodiment of the present invention comprises a front end signal processing device 1, a press button input device 2, a central processing unit (CPU) 3, an LCD controller 4, an LCD 5, and an alarm device 6.

The front end signal processing device 1 may process the signal of the detected current and voltage, and transmit the signal into the CPU 3.

The press button input device 2 may set the digital values of the maximum and minimum limit of the signal of the current and voltage by the digital press buttons, and may transmit the digital set values into the CPU 3.

The CPU 3 may receive the signals input from the front end signal processing device 1 and the press button input device 2, and may process the signals so as to drive the LCD controller 4 and the alarm device 6.

The LCD controller 4 may drive the LCD 5 having different colors to light according to the signals detected by the front end signal processing device 1 and according to the digital values of the maximum and minimum limit of the signal of the current and voltage set by the press button input device 2.

The alarm device 6 has a three-color back light module, and may properly emit the alarm sounds according to the signals detected by the front end signal processing device 1 and according to the digital values of the maximum and minimum limit of the signal of the current and voltage set by the press button input device 2.

Figure 2:
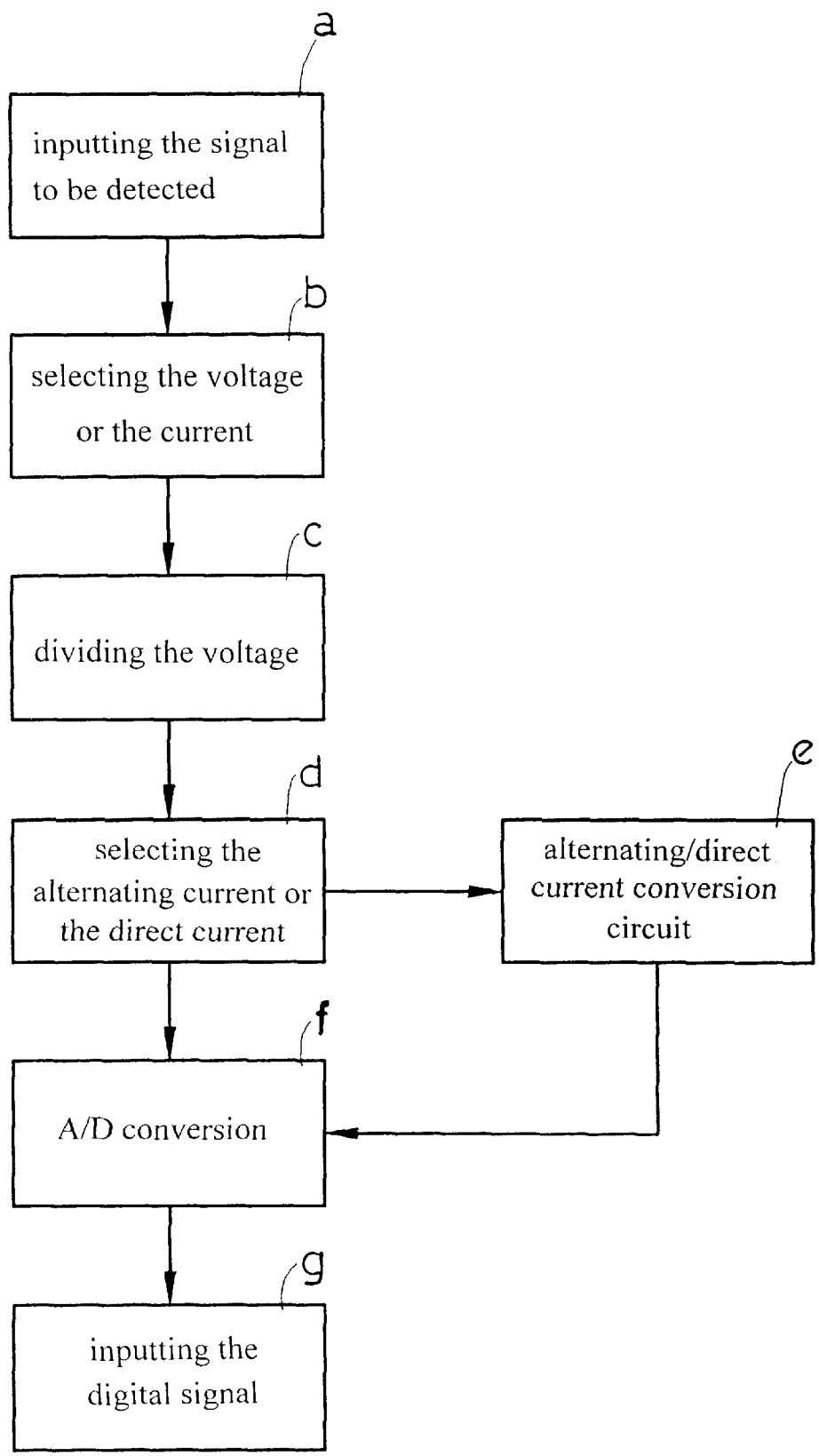
FIG. 2 is a flow chart of a digital meter for use of the current and voltage in accordance with a preferred embodiment of the present invention.

Referring to FIG. 2, the digital meter for use of the current and voltage in accordance with a preferred embodiment of the present invention has the following analogue hardware procedures.

(a) inputting the signal to be detected;

(b) selecting the voltage or the current;

(c) dividing the voltage;

(d) selecting the alternating current or the direct current;

(e) when the signal to be detected is the alternating current voltage, the alternating current voltage may enter alternating/direct current conversion circuit, so that the alternating current voltage may be converted into the direct current voltage;

(f) A/D conversion; and (g) inputting the digital signal.

Accordingly, the digital meter for use of the current and voltage in accordance with a preferred embodiment of the present invention has the following advantages.

1. When the signal value detected by the front end signal processing device 1 is greater than the digital values of the maximum limit of the signal of the current and voltage set by the press button input device 2 or smaller than the digital values of the minimum limit of the signal of the current and voltage set by the press button input device 2, the LCD controller 4 may drive the LCD 5 having different colors to light. Thus, the informed person may identify the detecting results of the current and voltage according to the different colors of the LCD 5, and the alarm device 6 may emit an alarm sound to warn the informed person, thereby providing an alarm effect.

2. The digital meter for use of the current and voltage may be operated easily and conveniently.

3. The different colors of the LCD 5 may indicate if the digital values of the detected current and voltage exceed the values of the maximum and minimum limit set by the press button input device 2, so that the detected results of the current and voltage is not limited to the space distance of the location of the informed person.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A digital meter for use of the current and voltage, comprising: a front end signal processing device, a press button input device, a central processing unit (CPU), an LCD controller, an LCD, and an alarm device, wherein:

the front end signal processing device may process the signal of the detected current and voltage, and transmit the signal into the CPU, the press button input device may set the digital values of the maximum and minimum limit of the signal of the current and voltage by the digital press buttons, and may transmit the digital set values into the CPU, the CPU may receive the signals input from the front end signal processing device and the press button input device, and may process the signals so as to drive the LCD controller and the alarm device, the LCD controller may drive the LCD having different colors to light according to the signals detected by the front end signal processing device and according to the digital values of the maximum and minimum limit of the signal of the current and voltage set by the press button input device, the alarm device has a three-color back light module, and may emit the alarm sounds according to the signals detected by the front end signal processing device and according to the digital values of the maximum and minimum limit of the signal of the current and voltage set by the press button input device.

2. The digital meter for use of the current and voltage in accordance with claim 1, wherein when the signals detected by the front end signal processing device is greater than the digital values of the maximum limit of the signal of the current and voltage set by the press button input device or smaller than the digital values of the minimum limit of the signal of the current and voltage set by the press button input device, the LCD controller may drive the LCD having different colors to light, so that the informed person may identify the detecting results of the current and voltage according to the different colors of the LCD.

3. The digital meter for use of the current and voltage in accordance with claim 1, wherein when the signals detected by the front end signal processing device is greater than the digital values of the maximum limit of the signal of the current and voltage set by the press button input device or smaller than the digital values of the minimum limit of the signal of the current and voltage set by the press button input device, the alarm device may emit an alarm sound to warn the informed person, thereby providing an alarm effect.

4. The digital meter for use of the current and voltage in accordance with claim 1, wherein the digital meter comprises the analogue hardware procedures of:

(a) inputting the signal to be detected;

(b) selecting the voltage or the current;

(c) dividing the voltage;

(d) selecting the alternating current or the direct current;

(e) when the signal to be detected is the alternating current voltage, the alternating current voltage may enter alternating/direct current conversion circuit, so that the alternating current voltage may be converted into the direct current voltage;

(f) A/D conversion; and (g) inputting the digital signal.

* * * * *